US012704540B2

(12) United States Patent
Khatir et al.

(10) Patent No.: US 12,704,540 B2
(45) Date of Patent: Aug. 11, 2026

(54) METHOD AND DEVICE FOR MEASURING THE STATE OF HEALTH OF SEMICONDUCTOR-BASED ELECTRONIC COMPONENTS

(71) Applicant: UNIVERSITE GUSTAVE EIFFEL, Champs sur Marne (FR)

(72) Inventors: Zoubir Khatir, Le Plessis Robinson (FR); Richard Lallemand, Paris (FR); Ali Ibrahim, Fontenay le Fleury (FR)

(73) Assignee: UNIVERSITE GUSTAVE EIFFEL, Champs sur Marne (FR)

( * ) Notice: Subject to any disclaimer, the term of this patent is extended or adjusted under 35 U.S.C. 154(b) by 147 days.

(21) Appl. No.: 18/712,479

(22) PCT Filed: Nov. 15, 2022

(86) PCT No.: PCT/EP2022/081876

§ 371 (c)(1),
(2) Date: May 22, 2024

(87) PCT Pub. No.: WO2023/094205

PCT Pub. Date: Jun. 1, 2023

(65) Prior Publication Data

US 2025/0012848 A1 Jan. 9, 2025

(30) Foreign Application Priority Data

Nov. 23, 2021 (FR) ...................................... 2112413

(51) Int. Cl.
*G01R 31/26* (2020.01)

(52) U.S. Cl.
CPC ..... *G01R 31/2642* (2013.01); *G01R 31/2619* (2013.01)

(58) Field of Classification Search
None
See application file for complete search history.

(56) References Cited

U.S. PATENT DOCUMENTS 6,879,177 B1 * 4/2005 Bolam ............... G01R 31/2879 324/762.09
7,668,682 B2 * 2/2010 Gonzalez ........... G01R 31/2837 714/724

(Continued)

FOREIGN PATENT DOCUMENTS

CN 118468764 A * 8/2024 ......... G01R 31/2642
EP 2564163 A2 3/2013
EP 3896414 A2 10/2021

OTHER PUBLICATIONS

Arya Abhina Vet al. "Accurate Online Junction Temperature Estimation of IGBT Using Inflection Point Based Updated I-V Characteristics" IEEE Transactions on Power Electronics, Institute of Electrical and Electronics Engineers, USA, vol. 36, No. 9, Mar. 17, 2021 (Mar. 17, 2021), pp. 9826-9836, [retrieved on Jun. 3, 2021] DOI: 10.I 109/TPEL.2021.306 6287 ISSN: 0885-89 93, XP011858202 cited in the application p. 9828, right-hand column, paragraph 2—p. 9834, right-hand column, paragraph I; figures 1-1 7.

(Continued)

*Primary Examiner* — Richard Isla
(74) *Attorney, Agent, or Firm* — Colson Law Group, PLLC

(57) ABSTRACT

A method for measuring the state of health, of at least one semiconductor-based power electronics, comprising: a—determining, at an initial time t0, a first current value I(t0)=I, ZCP0 when the voltage V is equal to a voltage V(t0)=V, ZCP0, the power electronics component then being in an "initial time" state; b—measuring a value of the current I at each subsequent time ti for which the user wishes to ascertain the quantitative indicator D(ti), when the voltage V at the time ti is equal to the voltage V,ZCP0, the power electronics component then being in a "time ti" state; c—the processor computing a quantitative indicator D(ti) of the degradation of the power electronics component at each (Continued)

subsequent time ti, the value of which indicator depends on the variation in the value of the current I between the "initial time" state and the "time ti" state.

15 Claims, 5 Drawing Sheets

(56) References Cited

U.S. PATENT DOCUMENTS

| | | | | |
|---|---|---|---|---|
| 8,103,463 | B2 * | 1/2012 | Kalgren | G01D 18/00 702/182 |
| 11,249,129 | B2 * | 2/2022 | Zhang | G01R 31/2608 |
| 2025/0199054 | A1 * | 6/2025 | Kiguchi | H02M 7/5387 |

OTHER PUBLICATIONS

"Physics-of-Failure, Condition Monitoring, and Prognostics of Insulated Gate Bipolar Transistor Modules: A Review", H. Oh, B. Han, P. McCluskey, C. Han and B. D. Youn, IEEE Transactions on Power Electronics, vol. 30, No. 5, pp. 2413-2426, May 2015.

On-line Health Monitoring of Wire-Bonded IGBT Power Modules using On-State Voltage at Zero-Temperature-Coefficient, N. Degrenne and S. Mollov, PCIM Europe 2018; International Exhibition and Conference for Power Electronics, Intelligent Motion, Renewable Energy and Energy management, 2018, pp. 1-7.

* cited by examiner

State of the art

State of the art

Sample 1

Sample 2

Sample 3

Test conditions:

$\Delta T_j = 40°C$ $T_{ref} = 55°C$ $t_{on}/t_{off} = 40ms/100ms$

Izcp (%)

N (Mcycles)

0 0.5 1 1.5 2 2.5 3

0 5 10 15 20 25 30 35

METHOD AND DEVICE FOR MEASURING THE STATE OF HEALTH OF SEMICONDUCTOR-BASED ELECTRONIC COMPONENTS

FIELD OF THE INVENTION

The present invention relates to a method and a device for measuring the state of health of electronic components.

More specifically, the invention relates to a method for monitoring the degradation by thermal fatigue of semiconductor-based power electronics components that may be bipolar, such as power diodes, or mixed, such as IGBT (Insulated Gate Bipolar Transistor) components.

TECHNOLOGICAL BACKGROUND

The electronic components used in the field of power electronics make it possible to manage the electrical energy or to perform an electrical energy conversion. These components are used in a wide variety of ways. They are found especially in electric vehicles (electric cars, buses, trains, subways, etc.) or in the field of renewable energy production, for example in wind turbines or photovoltaic panels, but also in transport and embedded networks ("Flexible Alternating Current Transmission System" (FACTS), Smart Grids, etc.), speed variation, as well as applications for the general public (household appliances, IT, etc.).

They are used in very broad power ranges, and are most often subjected to temperature cycling, which can be of considerable amplitude.

Thermal fatigue associated with operating conditions is the main factor in the aging of power components.

This phenomenon of thermal aging can be understood by means of the following example. An IGBT module, which belongs to the category of electronic components with mixed semiconductors, is depicted in FIG. 1. This figure shows that the chip is connected to the terminals for connection to the outside of the module via a bonding wire made of metal, for example aluminum.

During the operation of the module, the temperature of the various elements tends to vary, cyclically or not, with an amplitude that can reach several tens of degrees.

As the thermal expansion coefficients of these elements are different, temperature variations cause them to deform differently. This can lead to cracks in one or the other of these elements, especially the bonding wire, or even to a break in the association between two of these elements, for example at the chip/bonding-wire interface.

These various phenomena initially lead to a deterioration in the performance of a component, especially in terms of energy efficiency, and subsequently to component failure.

The IGBT module includes a heat-sink support, which makes it possible to discharge the heat generated during operation in the various parts of the module, especially in the chip, and to limit temperature variations within the module. However, this is not enough to prevent these temperature variations and thus the thermomechanical aging of the module.

Aging phenomena are described herein by way of example for an IGBT module, but similar phenomena can be observed for all semiconductor-based power components.

For all the scopes of use mentioned above (transport systems with electric traction, speed variation or energy conversion), monitoring the state of aging of these components is a major challenge, as it enables the maintenance operations to be optimized. Diagnosis operations prior to these maintenance operations can be carried out on a dedicated, equipped site, which requires the device to be moved to this site, interrupting the use thereof. It is also possible to carry out the diagnosis in situ, while the component is in use. Thus, the diagnosis can be carried out during the driving of a vehicle, or between two successive driving periods, without having to move the vehicle.

In cases wherein it is not desirable or possible to move the device that is equipped with the power electronics component, it is known to implement methods for measuring and controlling the temperature.

European patent application EP2564163A2 discloses an optical sensor for monitoring the temperature in a semiconductor module, such as an IGBT module, in order to prevent failures.

This method limits the temperature variations in the components, but does not provide an indicator of the aging of this component.

More commonly, and especially with a view to establishing in situ diagnoses, various indicators of the aging of electronic components have been proposed, including an on-state emitter-collector voltage (denoted $Vce_{ON}$ for an IGBT component) or a switching time. Such indicators are described in the paper "Physics-of-Failure, Condition Monitoring, and Prognostics of Insulated Gate Bipolar Transistor Modules: A Review", H. Oh, B. Han, P. McCluskey, C. Han and B. D. Youn, *IEEE Transactions on Power Electronics*, vol. 30, no. 5, pages 2413-2426 May 2015, or in the paper "Accurate Online Junction Temperature Estimation of IGBT Using Inflection Point Based Updated I-V Characteristics", A. Arya, A. Chanekar, P. Deshmukh, A. Verma and S. Anand, *IEEE Transactions on Power Electronics*, vol. 36, no. 9, pages 9826-9836 September 2021.

Most of these indicators require the additional measurement of the temperature of the power component. Thus, to be relevant, Vceon must be measured at a controlled junction temperature and for a fixed current value.

The temperature measurement is carried out, either directly or indirectly, with sensors which are complicated to implement and calibrate when sensor accuracy is high, as shown in table 1, page 9827 of the paper "Accurate Online Junction Temperature Estimation of IGBT Using Inflection Point Based Updated I-V Characteristics". To overcome these limitations, other temperature-independent indicators—or at least indicators that do not require a temperature measurement—of the state of health of the electronic components are thus sought.

The paper "On-line Health Monitoring of Wire-Bonded IGBT Power Modules using On-State Voltage at Zero-Temperature-Coefficient", N. Degrenne and S. Mollov, *PCIM Europe* 2018; *International Exhibition and Conference for Power Electronics, Intelligent Motion, Renewable Energy and Energy management,* 2018, pages 1-7, discloses a method for monitoring the degradation of an IGBT module based on the ZCP point of this module (this point being denoted as ZTC in this paper). The assumption underlying the tracking method used in this paper is that the ZTC point does not progress as the IGBT module degrades in the current/voltage plane. All the bipolar or mixed power components have, in the on-state, a negative temperature coefficient at low current levels, i.e. a temperature increase at constant intensity of the collector current, Ic, results in an increase in the collector-emitter voltage, denoted Vce, while they have a positive temperature coefficient at high current levels. Between these two behaviors lies a ZCP point ("Zero Coefficient Point"), i.e. a point on the static current/voltage characteristic (Ic, Vce) of the component (taken in a given state of health) for which the emitter-collector voltage V,ZCP corresponding to the collector current I,ZCP is independent of the temperature at which this voltage-current characteristic was plotted. This point can be seen in FIG. 2 of the present application and in FIG. 10 of the paper "On-line Health Monitoring of Wire-Bonded IGBT Power Modules using On-State Voltage at Zero-Temperature-Coefficient".

The ZCP point progresses depending on the wear on the power electronics component, but this progression has not been precisely documented until now, so that the utilization of this point was based on unproven or erroneous assumptions.

For example, the authors of the document "On-line Health Monitoring of Wire-Bonded IGBT Power Modules using On-State Voltage at Zero-Temperature-Coefficient" make the a priori assumption that the intensity of the collector current I,ZCP is independent of the state of health of the component, whereas the voltage V,ZCP increases as the component ages. On the basis of this assumption, they propose repeatedly measuring the voltage V,ZCP with I,ZCP set to a value determined by an initial calibration of the component, at the start of the use thereof.

However, this assumption appears to be incorrect in light of the publication "Accurate Online Junction Temperature Estimation of IGBT Using Inflection Point Based Updated I-V Characteristics", A. Arya, A. Chanekar, P. Deshmukh, A. Verma and S. Anand, *IEEE Transactions on Power Electronics*, vol. 36, no. 9, pages 9826-9836 September 2021. This publication proposes a temperature sensor for an electronic component using indirect measurement with good accuracy.

At the same time, this document suggests the possibility of monitoring the state of health of such a component by measuring its resistance. This proposal is also based on the assumption that the intensity of the collector current I,ZCP (referred to in this paper as Ic,inf) is independent of the state of health of the component. This assumption is recalled especially in paragraph III.A.2): "the value of Ic,inf is assumed to be same for HIVC [healthy characteristic] and DIVC [degraded characteristic]".

However, the measurements presented in FIGS. 14*a* and 14*b* contradict this assumption. This figure shows the zero temperature coefficient point, and in particular that the intensity of the current at this point depends on the state of wear of the component. It is therefore likely that the indicators proposed in the two papers previously disclosed are not sufficiently precise.

The aim of the invention is to propose a method for monitoring in real time the degradation of the state of a semiconductor-based power electronics component, which may be bipolar or mixed, this method being inexpensive, easy to implement and usable for predictive maintenance purposes.

SUMMARY OF THE INVENTION

The invention thus relates to a method for measuring the state of health, at one or more times ti, of at least one semiconductor-based power electronics component by computing a quantitative indicator D(ti) of the degradation of the power electronics component, the power electronics component having at least one input terminal and one output terminal of an electric current of intensity I, between which a voltage V is established, the electronic component having a temperature-independent zero temperature coefficient point ZCP, the method using an electric current sensor, a voltage sensor and a processor exchanging information with the electric current and voltage sensors, the method comprising:

- a—a first step of determining, at an initial time t0, a first current I(t0)=I,ZCP0 when the voltage V is equal to a voltage V(t0)=V,ZCP0, the power electronics component then being in an "initial time" state;
- b—a step of measuring a value of the current I at each subsequent time ti for which the user wishes to ascertain the quantitative indicator D(ti), when the voltage V at the time ti is equal to the voltage V,ZCP0, the power electronics component then being in a "time ti" state;
- c—a step of the processor computing a quantitative indicator D(ti) of the degradation of the power electronics component at each subsequent time ti, the value of which indicator depends on the variation in the value of the current I between the "initial time" state and the "time ti" state. By virtue of these provisions, the monitoring of the health of the electronic component is simplified and carried out with greater sensitivity than that obtained with the conventional indicator based on "$Vce_{ON}$". Especially, it requires only a voltage sensor and a current sensor. It is not necessary to implement a temperature sensor.

The invention especially relates to a method for measuring the state of health, at one or more times ti, of at least one semiconductor-based power electronics component by computing a quantitative indicator D(ti) of the degradation of the power electronics component, the power electronics component having at least one input terminal and one output terminal for an electric current of intensity I, between which a voltage V is established, the electronic component having a temperature-independent zero temperature coefficient point ZCP, the method using an electric current sensor, a voltage sensor and a processor exchanging information with the electric current and electric voltage sensors, the method comprising:

- a—a first step of determining, at an initial time t0, a first current I(t0)=I,ZCP0 when the voltage V is equal to a voltage V(t0)=V,ZCP0, the power electronics component then being in an "initial time" state;
- b—a step of measuring a current I(ti)=I,ZCP(ti) at each subsequent time ti for which the user wishes to ascertain the quantitative indicator D(ti), when the voltage V at the time ti is equal to the voltage V,ZCP0, the power electronics component then being in a "time ti" state;
- c—a step of the processor computing a quantitative indicator D(ti) of the degradation of the power electronics component at each subsequent time ti, the value of which indicator depends on the variation in the value of the current I between the "initial time" state and the "time ti" state.

According to various aspects, it is possible to provide one and/or the other of the features hereunder taken alone or in combination.

In one embodiment, no temperature sensors are implemented and no temperature estimation is required for steps a, b and c of the method, as the quantitative indicator D(ti) of the degradation of the electronic component is independent of the temperature.

The information on the temperature is indeed unnecessary, as the zero temperature coefficient point is by definition independent of the temperature at which the component operates, and at which the one or more current/voltage characteristics (I,V) are established. As a consequence, it is no longer necessary to maintain the temperature of the electronic component at a value suitable for measurement, as is the case with some methods of the background art. Thus, the method does not require temperature measurement, resulting in lower implementation costs.

According to one embodiment, the measuring method comprises, prior to step a:

i—a step comprising at least two series of measurements of the electric current I by the electric current sensor and of the voltage V by the voltage sensor, the series of measurements (I,V) being taken at different temperatures;

ii—a step of the processor computing a voltage value V,ZCP0 and an electric current value I,ZCP0 at the zero temperature coefficient point ZCP, from the measurements of step i, the zero temperature coefficient point ZCP being the intersection point of the two series of measurements (I, V) of step i, the current I(t0) and the voltage V(t0) at the initial time being equal to I,ZCP0 and V,ZCP0, respectively.

By virtue of this arrangement, the zero temperature coefficient point can be determined with good accuracy, which makes it possible to improve the accuracy of the method for monitoring the state of health of the electronic component.

According to one embodiment of the measuring method, the at least one semiconductor-based power electronics component is embedded or installed in an operational electrical system, the method for measuring the state of health of the component being carried out while the electrical system is in operation.

Thus, health monitoring is not limited to an ex situ study of the electronic component, and health monitoring is suitable for all uses of the electronic component.

According to one embodiment, the voltage V(ti) is measured in step b with a relative accuracy that depends on the type of power electronics component, this relative accuracy having a value of less than 5%.

It has indeed been observed that an indicator of the state of health of the electronic component according to the invention, based on the zero temperature coefficient point, provides an indication of sufficient accuracy as soon as the voltage V(t0) measured in step b differs by less than 5% from the voltage V,ZCP0 measured in step a.

According to one possible embodiment, the method for measuring the state of health of the component, especially for determining the progression of its aging and degradation, is implemented iteratively over time by different measurements of current I(ti) at different times ti, these currents I(ti) being measured when the voltage V at these different times ti is equal to the voltage V,ZCP0, and being compared with the current I(t0)=I,ZCP0 at the initial time t0.

Thus, the method for monitoring health comprises successive measurements that make it possible to determine the quantitative indicator of degradation D(ti) at successive times ti. It therefore makes it possible to monitor the state of health of the electronic component.

According to one embodiment, the degradation relates to the degradation of the electrical interconnections of the components.

Thus, the monitoring of health reflects the state of the electrical interconnections. It is therefore localized, making it possible to repair the degraded interconnection or to replace the component in question.

The invention also relates to a device for measuring the state of health, at one or more times ti, of at least one semiconductor-based power electronics component by computing a quantitative indicator D(ti), the measuring device having at least one electric current input terminal and one output terminal for the electric current of intensity I, between which a voltage V is established, the power electronics component having a temperature-independent zero temperature coefficient point ZCP, the device comprising an electric current sensor, a voltage sensor and a processor exchanging information with said sensors, configured to implement the following steps:

a—a first step of determining, at an initial time t0, a first current I(t0)=I,ZCP0 when the voltage V is equal to a voltage V,ZCP0, the power electronics component then being in an "initial time" state;

b—a step of measuring a value of the current I(ti) at each subsequent time ti, when the voltage V at the time ti is equal to the voltage V,ZCP0, the power electronics component being in a "time ti" state;

c—a step of the processor computing a quantitative indicator D(ti) of the degradation of the power electronics component, the value of which indicator depends on the variation in the value of the current I between the "initial time" state and the "time ti" state.

By virtue of these arrangements, the device can be arranged inside a system to monitor the continuous state of health of one or more components, and does not necessarily comprise a temperature sensor.

According to one embodiment of the measuring device, the at least one semiconductor-based power electronics component is bipolar or mixed.

Thus, the measuring device makes it possible to study the state of health of complex electronic components.

The invention also relates to a power electronics module integrating a measuring device for measuring at least two electronic components in parallel and/or in series.

Thus, the measuring device can be arranged in a system and makes it possible to monitor the health of an electronic component made up of several components placed in parallel or in series, simultaneously or separately.

The invention further relates to a system embedding: one or more power electronics modules, with the device for measuring at least one power electronics component integrated into each module providing a degradation indicator.

Thus, these systems are self-contained and can monitor the state of health of each of their components or groups of components without having to use an external means.

The invention also relates to a system embedding: one or more power electronics modules, the measuring device of at least one power electronics component integrated into each module providing at least one indicator of degradation of at least one power electronics component of this module.

The invention also relates to a system embedding one or more power electronics modules according to the preceding embodiments, the system being a system for managing electrical energy and/or converting electrical energy for renewable energies or a transport system with electric traction or a stationary system.

The invention also relates to a computing program comprising program code instructions for executing the steps of the method for measuring the state of health of a semiconductor-based power electronics component according to one of the preceding embodiments when the program is executed by a processor.

Thus, the monitoring of the state of health may be automated and does not require human intervention.

According to one embodiment of the computing program, the method for measuring the state of health is applied to the system embedding one or more power electronics modules according to one of the preceding embodiments, and if the measuring method returns a quantitative indicator of degradation greater than a predetermined threshold value, the computing program applies the measuring method to each semiconductor-based power electronics component of the system embedding one or more power electronics modules Thus, the measuring method can be used to verify the overall state of health, before applying the measuring method to each component in order to identify the component undergoing degradation. The first measurement saves computing time when the overall state of health does not show any degradation.

The crossing of a threshold, previously set on the quantitative indicator D(ti) of the degradation of an electronic component, can especially be detected automatically and generate an alert for the user.

The invention also relates to a method for measuring the state of health, on a date t, of a semiconductor-based electronic component having at least one input terminal and one output terminal and exhibiting a zero temperature coefficient point on the date t, the method comprising:

a1—measuring an intensity I,ZCP(t) of an electric current flowing through the input terminal on the date t at the zero temperature coefficient point of the steady-state electronic component by means of an electric current sensor, a voltage V between the input terminal and the output terminal being equal to a voltage between these terminals at the zero temperature coefficient point V,ZCP.

b1—by means of a first processor configured to receive information from the electric current sensor, computing a quantitative indicator of the state of health of the electronic component from the intensity of the electric current flowing through the measured input terminal I,ZCP(t).

In one embodiment of the method for measuring the state of health, on a date t, of a semiconductor-based electronic component, no temperature sensor is implemented for steps a1 and b1.

In one embodiment, the method for measuring the state of health, on a date t, of a semiconductor-based electronic component comprises, prior to step a:

i1—successively setting the temperature of the electronic component, taken in an initial state, to at least two different temperatures by means of a temperature control device, and measuring at least two voltages V between the input and output terminals at each of the at least two temperatures by means of a voltage sensor for two different electric currents flowing through the input terminal, said electric currents being measured by means of an electric current sensor;

ii1—by means of a processor configured to receive information from said voltage and electric current sensors, computing a value of the voltage V,ZCP at the zero temperature coefficient point from said measured electric currents and voltages.

In one embodiment of the method for measuring the state of health, on a date t, of a semiconductor-based electronic component, said second processor is also used to compute a value for the intensity I,ZCP,in of the current flowing through the input terminal at the zero temperature coefficient point of the electronic component in its initial state, from said electric currents and voltages measured in step iI. According to one embodiment of the method for measuring the state of health, on a date t, of a semiconductor-based electronic component, the quantitative indicator of the state of health of the component depends on the intensity of the electric current flowing through the input terminal I,ZCP(t) on the date t.

According to one embodiment of the method for measuring the state of health, on a date t, of a semiconductor-based electronic component, a value of the intensity I,ZCP,in of the electric current flowing through the input terminal at the zero temperature coefficient point of the electronic component taken in an initial state is also provided, wherein the quantitative indicator of the state of health of the component depends only on the intensity of the electric current flowing through the input terminal I,ZCP(t) on the date t and on the intensity of the electric current flowing through the input terminal in the initial state I,ZCP,in.

According to one embodiment of the method for measuring the state of health, on a date t, of a semiconductor-based electronic component, the voltage between the input and output terminals at the zero temperature coefficient point V,ZCP is set with a relative accuracy having a value of less than 5%.

According to one embodiment of the method for measuring the state of health, on a date t, of a semiconductor-based electronic component, the measuring method is implemented iteratively over time.

The invention also relates to a device for measuring the state of health, on a date t, of a semiconductor-based electronic component having at least one input terminal and one output terminal and exhibiting a zero temperature coefficient point, the device comprising an electric current sensor and at least one processor configured to implement the following steps:

a1-measuring an intensity of an electric current flowing through the input terminal I,ZCP(t) on the date t at the zero temperature coefficient point of the steady-state electronic component by means of the electric current sensor, a voltage between the input and output terminals being equal to a voltage between the input and output terminals at the zero temperature coefficient point V,ZCP.

b1-computing by means of the processor a quantitative indicator of the state of health of the electronic component from the intensity of the electric current flowing through the input terminal I,ZCP(t) measured.

BRIEF DESCRIPTION OF THE DRAWINGS

Embodiments of the invention will be described below with reference to the drawings, which are briefly described below.

Figure 1:
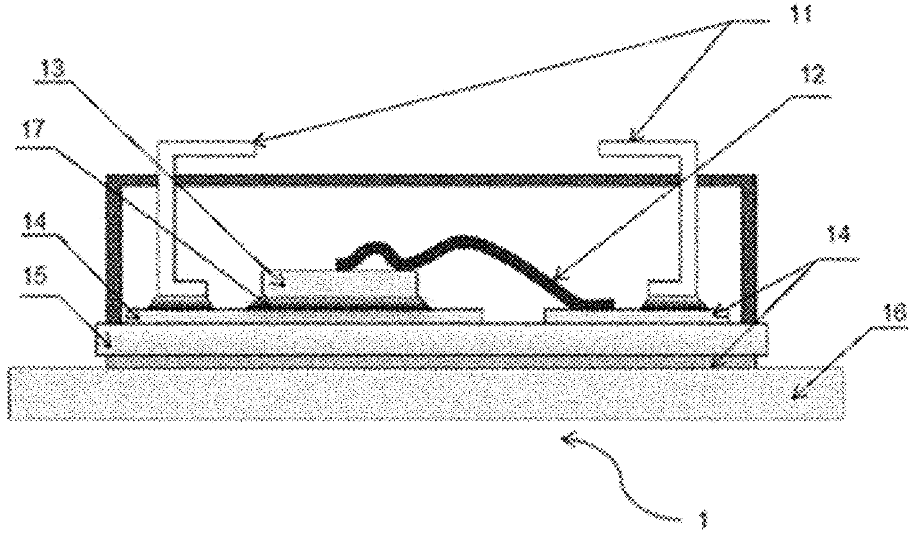
FIG. 1 depicts an IGBT module according to the state of the art.

In the drawings, identical references designate objects that are similar or the same.

DETAILED DESCRIPTION

The invention relates to a method for measuring (or equivalently monitoring) the state of health (or equivalently state of wear or state of degradation) of a component for power electronics, and in particular a semiconductor-based power electronics component 1 which may be of the bipolar or mixed type.

The state of health of a component is determined by the deviation or degradation of the performance of the component with respect to its initial performance.

Especially, the power electronics components enable the conversion of electrical waves (DC to DC, DC to AC and vice versa, AC to AC) and the control of the electrical power thus converted by means of electronic components, i.e. small-scale elements in front of the powered systems. By way of example, bipolar diodes and bipolar power transistors are power electronics components of the bipolar type, i.e. two types of charge carriers (holes and electrons) circulate in the on-state.

Insulated-gate bipolar transistors ("IGBTs") integrate an MOS transistor and a bipolar transistor on the same chip 13. They belong to the mixed power electronics components. The architecture of a mixed-type semiconductor-based power electronics component 1 is depicted schematically in FIG. 1.

Although the power electronics components are initially configured to have low losses, the conditions to which they are subjected during use lead to degradation of the component.

A distinction is made between the failure modes at the chips 13 and the failure modes at the assembly of the component.

The multilayer structure of a semiconductor-based power electronics component causes mechanical stress at the interfaces when it heats up and then cools down, due to the differences in the coefficients of thermal expansion of these different materials. In particular, temperature variations of significant amplitude (a few tens of degrees) cause cracks or even fractures near the interfaces between the different materials that make up the component.

Failure modes in the assembly of the power electronics component thus comprise the degradation of the insulating ceramic substrate 15, the degradation of the soldering materials used to bond the power connection terminals 11 to the metallized ceramic substrate (14 and 15), the degradation of the solder 17 used to bond the chip to the ceramic substrate (14 and 15), and the degradation of the bonding wires 12 used to connect the chip 13 with the power connection terminals 11.

It is mainly these last two types of degradation that can be diagnosed by the method for monitoring the state of health of a power electronics component according to the invention. Both types of degradation lead to an increase in the interconnect resistance and are therefore detected by the invention. Among other things, the lifting of the bonding wires 12 can be seen as a result of the propagation of a crack in the wire at the wire 12/chip-plating 13 interface, as can the fracture in the feet of the bonding wires 12, which results from the elongation of the wire during each current cycle and is mainly due to the self-heating of the wire.

As explained previously, the power electronics components, regardless of their state of health, have a zero temperature coefficient point.

The semiconductor-based power electronics component has at least one input terminal and one output terminal for an electric current of which the intensity is denoted I. Between these input and output terminals, a voltage is established, denoted V.

Figure 2:
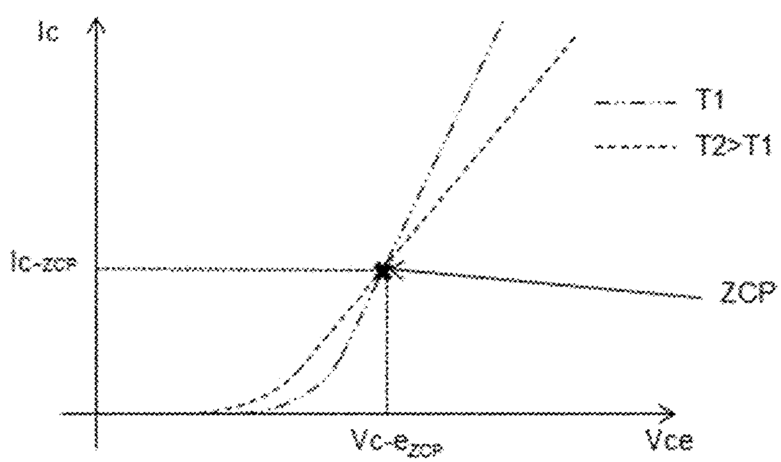
FIG. 2 depicts the schematic static features (Ic, Vce) of an IGBT module, at two temperatures T1 and T2, such that T1<T2 according to the state of the art.

The point, referred to as ZCP(for "Zero Coefficient Point") hereinafter, is the point of intersection of all the on-state static characteristics (I,V) obtained at different nominal operating temperatures for a given state of health of the component. The ZCP point can be seen in FIG. 2. The ZCP point is defined by its coordinates, namely the intensity of the electric current I,ZCP and the voltage V,ZCP, which can especially be measured in DC mode.

The ZCP point depends on the state of health of the component, but not on the temperature since, by definition, regardless of the temperature at which the power electronics component is found, its static characteristic passes by this point.

The state of health of the electronic component may not vary between two successive times, which means that the electronic component has not degraded. This state of health may also vary between two successive times if the electronic component has been subjected to conditions leading to its degradation.

If the state of health of the electronic component is the same at two times ta and tb, but the temperature varies, the coordinates of the ZCP point are unchanged between ta and tb, as this ZCP point is independent of the temperature for a given state of health of the power electronics component.

For a given state of degradation identified by the quantitative indicator D, the ZCP point can be mathematically defined as the point for which the partial derivative of the function I(V, T, degradation) or equivalently of the function V(I, T, degradation) with respect to temperature is zero:

$$\left(\frac{\partial V}{\partial T}\right)_{I,degradation}(I, ZCP, D) = 0 \quad \text{Formula 1}$$

$$\left(\frac{\partial I}{\partial T}\right)_{v,degradation}(V, ZCP, D) = 0 \quad \text{Formula 2}$$

While the existence of the ZCP point is well known to those skilled in the art, its progression as the power electronics component is used is not documented. Until now, a skilled person would have tended to consider that I,ZCP is independent of degradation, while V,ZCP increases over time. The invention is based on a detailed and unprejudiced study of the progression of the position of the ZCP point over time.

This study has shown that, contrary to current prejudice, the intensity of the electric current I,ZCP varies significantly, whereas the voltage V,ZCP changes little with the degradation of the state of the power electronics component.

Figure 4:
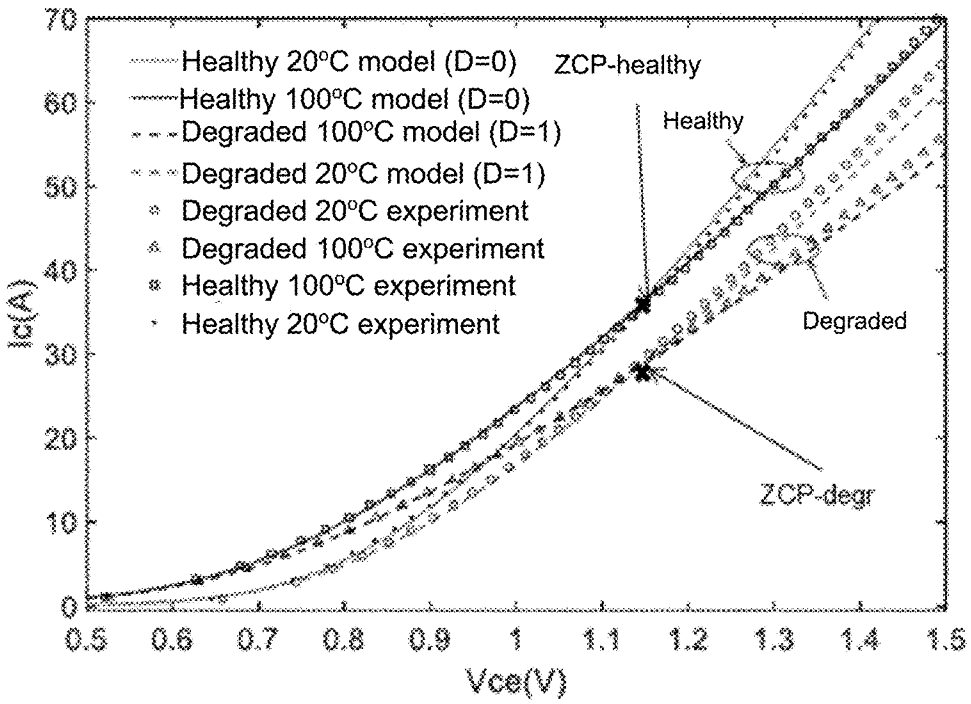
FIG. 4 depicts, in the plane (Vce, Ic), the position of the ZCP point of an IGBT module depending on the degradation of the module, obtained under real conditions, as well as the positions of this point obtained from a simulation of this module.

The study underlying the invention is based both on experimental measurements, for which the Mitsubishi component, bearing the reference CMT150TX, was subjected to 107,000 cycles of 90° C. amplitudes with a minimum temperature of 35° C., during which the position of the ZCP point was regularly monitored at the same time as the state of health of the component, measured using a conventional technique. In this case, the state of health of the component was monitored using the V,ZCP0 measuring method, with this quantity being used as a reference indicator. The results of this study can be seen in FIG. 4, depicting the static current I/voltage V characteristics obtained at several temperatures and corresponding to successive states of health of the power electronics component.

The experiments were carried out on a Mitsubishi IGBT module bearing reference CMT150TX.

The point of intersection of a cluster of characteristics corresponding to a given state of health is the ZCP point corresponding to that state of health.

Thus, the intersection of the locus of the black circles (actual curve on a healthy module at 20° C.) and the black-edged white squares (actual curve on a healthy module at 100° C.) corresponds to the ZCP point of the healthy module (ZCP-healthy, D=0).

The intersection of the locus of the black-circled white circles (actual curve on a degraded module at 20° C.) and the black-edged white triangles (actual curve on a degraded module at 100° C.) corresponds to the ZCP point of the degraded module (ZCP-degr, D=1).

The indicator D is a quantitative indicator of the level of degradation of the IGBT module. In this case, D=0 corresponds to a new (or equivalently healthy) module. D=1 corresponds to a relative increase of 5% in the reference degradation indicator of the background art. In this case, the reference indicator is the voltage V measured at a temperature equal to 35° C. and for a current equal to 60 A.

The solid and dashed curves in FIG. 4 corresponding to each of the previous curves were obtained by the simulation described in the following paragraphs. A good match between the real curves and the simulated curves makes it possible to validate the simulation subsequently.

FIG. 4 shows that the ZCP point progresses almost vertically, rather than horizontally as assumed in the background art.

In other words, the study carried out by the inventors shows that V,ZCP depends little on the state of health of the component, while I,ZCP decreases in an observable manner as the power component degrades.

Figure 3:
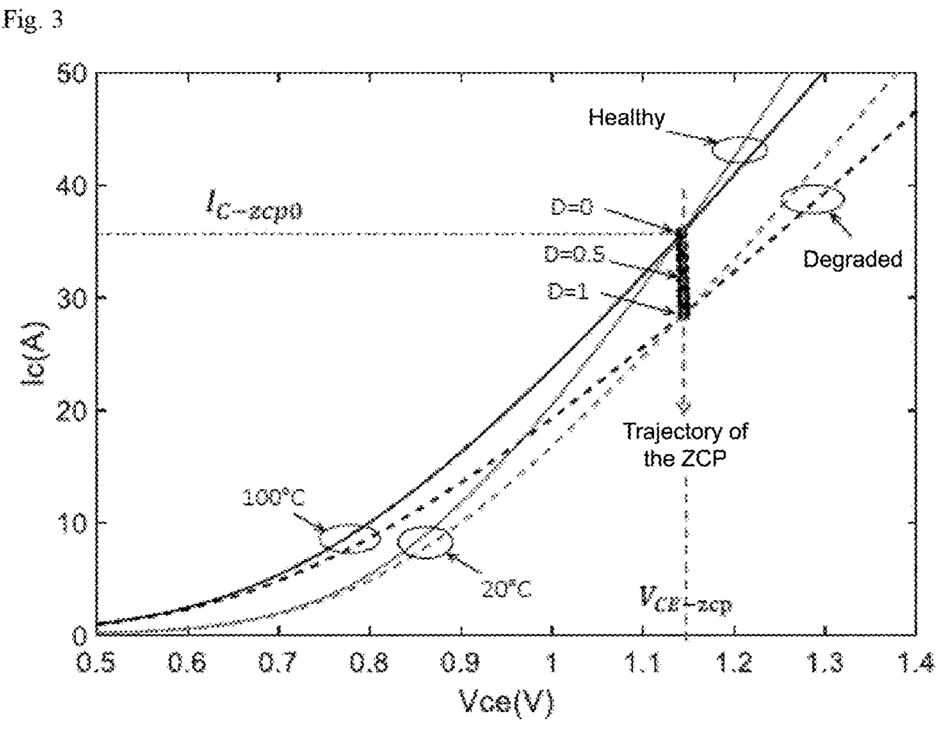
FIG. 3 depicts, in the plane (Vce, Ic), the position of the ZCP point of an IGBT module depending on the degradation of this module, obtained from a simulation of this module.

These experimental observations were confirmed by simulations based on electrothermal models of the chip and its connections. An example of a simulation result is shown in FIG. 3.

The simulation was carried out by modeling the on-state current/voltage characteristic (Ic, Vce) of the IGBT component as the sum of that of a PIN diode, a MOS transistor and the interconnection due to the bonding wires. This model is typical of what can be found in the state of the art. The model used is a physical model that takes into account the effect of temperature, as well as the damage of the interconnection by introducing a contact resistance that reflects the rate of degradation.

As in FIG. 4, the indicator D is a quantitative indicator of the level of degradation of the simulated IGBT module. In this case, the value D=0 corresponds to a new (or equivalently healthy) module. The value D=1 corresponds to a relative increase of 5% in the reference degradation indicator of the background art. In this case, the reference indicator is the voltage V measured between the collector and emitter terminals at a temperature equal to 35° C. and for a current flowing through the collector terminal with an intensity equal to 60 A.

To make the graph easier to read, only the curves corresponding to D=1 and D=0 have been depicted, but the ZCP points corresponding to intermediate values of D have been obtained in the same way.

The graph clearly shows that, as observed experimentally, the voltage V,ZCP obtained by the simulation is independent of aging with the accuracy of the simulation. In this case, it is of the order of 1.14 V.

On the other hand, I,ZCP decreases significantly with aging, from a value of around 36 A for D=0 to a value of around 28 A for D=1, i.e. a relative variation of 22% with respect to its initial value.

As a result, if V,ZCP is known at the beginning of the life of the power component, it is possible to propose a method for monitoring the health of this component based solely on knowledge of this voltage and on the measurement of I,ZCP, this method not requiring a temperature measurement at any time.

The semiconductor-based power electronics component is subject to thermal fatigue, leading to degradation during use. The component can be used for routine or intensive applications.

The degradation of the power electronics component concerns the degradation of the electrical interconnections of the components, e.g. top connection wires and/or chip solder.

The semiconductor-based power electronics component has at least one current input and output terminal, and has a zero temperature coefficient point ZCP at the time t in its direct current I and voltage V characteristics.

Depending on the type of electronic component, the generic notations I and V of the present application may correspond to different notations used in the background art.

Especially, if the input terminal is a collector terminal C and the output terminal is an emitter terminal E, the intensity of the current may be denoted Ic and the voltage between these terminals Vce. For a component such as a diode, having an anode and a cathode, the voltage between the anode input terminal A and the cathode output terminal K may be denoted Vak. The one or more power electronics components can be installed or embedded in an operating electrical system.

Generally, the word "embedded" is reserved for mobile or transport applications such as vehicles, buses, trains, etc., and "installed" is introduced to refer to stationary applications, i.e. immobile systems such as buildings, renewable energy systems, etc.

The semiconductor-based power electronics component or components are bipolar or mixed. The one or more components are, for example, an IGBT power component, a diode, transistor, thyristor, etc.

The measuring method is capable of indicating the state of health, at a time t, of at least one semiconductor-based power electronics component having at least one input terminal and one output terminal for an electric current of intensity I, between which a voltage V is established, for example if the component is subjected to thermal fatigue leading to its degradation.

The method described in the present invention uses an electric current sensor, a voltage sensor and a processor that exchanges information with these sensors. The sensors collect the data necessary for the processor to establish the zero temperature coefficient point ZCP of the power electronics component studied by the method.

The zero temperature coefficient point ZCP is characterized by its coordinates (I,ZCP; V,ZCP), which are independent of the temperature.

The method may comprise the following steps:

a—a first step of determining, at an initial time to, a first value of the intensity I: I(t0)=I,ZCP0, when the voltage V is equal to the voltage V,ZCP0, the power electronics component being in an "initial time" state;

b—a step of measuring a value of the current I:I(ti) at one or more subsequent times ti, when the voltage V at the time ti is equal to the voltage V,ZCP0, the power electronics component being in a "time ti" state, I(ti) in this case being equal to I,ZCP(ti) (due to the fact that the time ti is defined as a time for which the voltage V(ti) is equal to the voltage V,ZCP0, and that the zero temperature coefficient point ZCP lies on a vertical line flowing through V,ZCP0 in the current/voltage plane);

c—a step of the processor computing a quantitative indicator D(ti) of the degradation of the power electronics component at each time ti, the value of which indicator depends on the variation in the value of the current I between the "initial time" state and the "time ti" state.

Note that since V,ZCP depends little on the state of health of the component, if this voltage in the initial state is denoted V,ZCP0, then V,ZCP0≈V,ZCP(ti) regardless of the time ti. Setting the steady-state voltage to the value V,ZCP—and therefore in particular to the value V,ZCP0—for the current measurement therefore ensures that the operating point of the electrical component is the zero temperature coefficient point of the component at that time. As a result, the electric current I(ti) in the time t state matches the current I,ZCP(ti) at the zero temperature coefficient point of the electronic component, and is measured under these conditions, without the need for any additional measurement, especially by means of a temperature sensor.

To determine the value of the voltage V,ZCP0 used in step a and step b, especially when this value is not included in the data of the supplier of the power electronics component, measurements can be recorded "on the fly" and during the operation of a phase of variation of the current I, and of the corresponding voltage V, over a range for which the current passes through the ZCP point. For example, during a current rise phase or a current fall phase, the component is in its on-state.

"On the fly" refers to a series of very rapid successive measurements. These phases may last a few milliseconds, during which time the recordings are stored in the memory of the processor at a sampling frequency that is sufficient and suited to the application, e.g. every microsecond when the variations are very quick. During these phases, the pairs of points (I,V) describe one of the curves shown in FIG. 2, and therefore pass through the ZCP point at a given but unknown temperature. It is necessary to carry out these measurements at two different times during operation, when the temperatures of the components will be different, for example at system start-up, when the temperature will be low, and after a short period of operation, when the component will be in a higher temperature state. The search for the point of intersection of the two curve portions thus obtained by means of a processor will determine the ZCP point in the initial state. It is not necessary to regulate or set an operating temperature. It is not necessary to know the value of the operating temperature in order to obtain the ZCP point. Although this is possible, it will not be necessary to reproduce these measurements outside the initial state (t0).

In the course of its use, the power electronics component spontaneously passes very frequently into a "time ti" state, for which the voltage V is equal to V,ZCP0. To achieve this, it is sufficient to retain and process only those measurements taken in the "times ti" states during typical phases of operation of the component which lead it to pass through these states, and which can be detected by the voltage passing through or near V,ZCP0. By way of example, an IGBT-type power electronics component used in an elevator goes into a time ti state for each acceleration phase or during each deceleration phase, i.e. up to several tens or even hundreds of times per day. Consequently, it is sufficient to measure the voltage V repeatedly, for example during carefully chosen phases (e.g. the acceleration phase in the previous example), with a characteristic time for repeating the measurements (referred to as sampling time) chosen so that:

either the "time ti" state is reached for at least one measurement of voltage V, the current in this case also being measured at the same time, without any particular choice of the dates at which the measurements of V are repeated, or the "time ti" state is reached transiently between at least two successive measurement dates t1 and t2 of the voltage V, so that by interpolation between these two successive measurement dates, it is possible to reconstitute information on the time ti state, ti being between t1 and t2. For example, if a linear interpolation is performed, ti can be deduced from the relation:

$$\frac{V,ZCP0-V(t1)}{V(t2)-V(t1)}=\frac{ti-t1}{t2-t1} \qquad \text{Formula 3}$$

since, by definition of the time ti state, V(ti)=V,ZCP0. In the same case, if a linear interpolation is performed:

$$\frac{I,ZCP(ti)-I(t1)}{I(t2)-I(t1)}=\frac{ti-t1}{t2-t1} \qquad \text{Formula 4}$$

Other types of "non-linear" interpolations, such as quadratic interpolation, are also possible. The choice of the interpolation method may depend on the accuracy with which the voltage V,ZCP is to be measured.

In view of the variations in voltage V and current I in common power electronics components under common operating conditions, it is possible with the method described hereinbefore to define numerous pairs (t1,t2), for example on a daily basis.

It is possible to measure current and voltage continuously, and to record and process only those values for which the voltage V passes through or near V,ZCP0. In this way, no strategy for selecting times ti is necessary, apart from choosing the characteristic duration of the time interval between any two successive times ti for monitoring the state of health of this component.

By way of non-limiting example, for a typical IGBT component, the time between two successive measurements (so-called sampling time) can range from milliseconds ($10^{-3}$ seconds, 1 ms) to tens of microseconds ($10^{-5}$ seconds, 10 μs), depending on the speed of acquisition of the measurements available to the measurement device. Thus, the voltage progresses little between two successive measurements, and interpolation is entirely possible. Such a short sampling time may not allow all the measurement data to be stored. In this case, the measurement results are only stored (e.g. in a storage memory) when V passes through a window in the vicinity of VZCP(in an increasing or decreasing fashion).

In another embodiment, it may be chosen to define the one or more times ti beforehand. For example, the times ti can be chosen over ranges in which the power electronics component is not called upon for its nominal use, for example typically when a device in which the power electronics component is embedded is not in use, or is inoperative. In this embodiment, the voltage V can be made to assume the value V,ZCP0 at the time ti, especially by means of a voltage generator, so as to deliberately place the power electronics component in a "time ti" type state.

In one possible embodiment, the measuring method does not use any temperature sensors or temperature estimation to carry out the previously disclosed steps a, b and c. Advantageously, no temperature sensor is used during the entire method.

In one possible embodiment, the measuring method comprises two preliminary steps prior to step a:

- i—a step comprising at least two series of measurements of the electric current I by the electric current sensor and of the voltage V by the voltage sensor, the series of measurements (I,V) being taken at different temperatures;
- ii—a step of the processor computing a voltage value V,ZCP0 and an electric current value I,ZCP0 at the zero temperature coefficient point ZCP, from the measurements of step i, the zero temperature coefficient point ZCP being the intersection point of the two series of measurements (I, V) of step i, the current I,ZCP(t0) and the voltage V,ZCP(t0) in the "initial time" state being equal to I,ZCP0 and V,ZCP0, respectively.

These two preliminary steps can be carried out on the power electronics component in the new state or in an initial state different from the new state, for example an initial state for which the electronic component can be considered non-degraded.

The two or more different temperatures are not necessarily determined. In one particular embodiment, the temperatures are not quantified during the method. These preliminary steps and/or the steps of the method can be carried out in situ, once the power electronics component has been installed or embedded in an operating electrical system, or before the electronic component is finally installed. It is also possible to use the component datasheets directly, wherein the ZCP crossing points are given.

Figure 6:
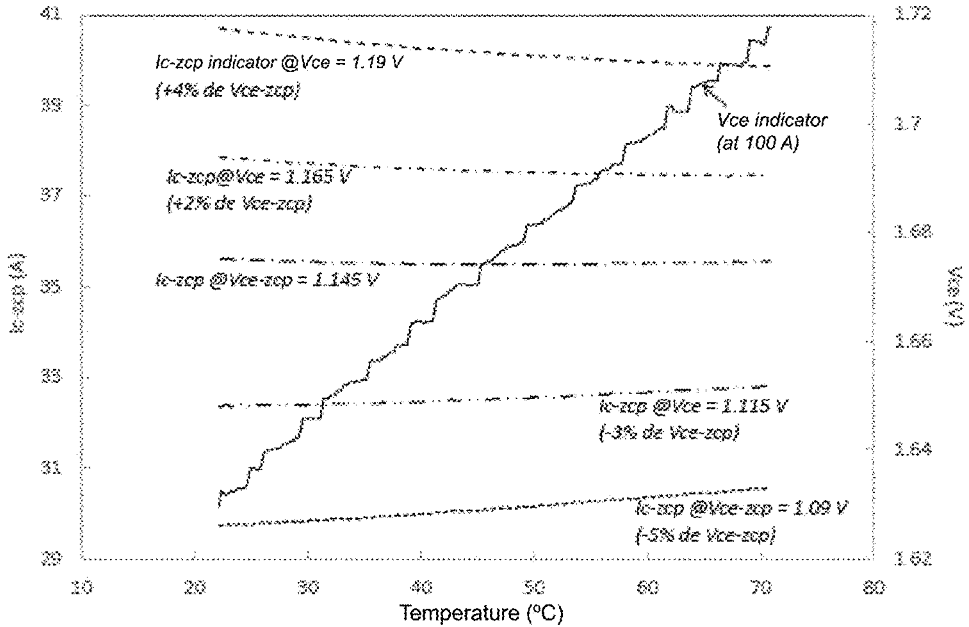
FIG. 6 depicts the variations of the aging indicator I,ZCP according to the invention depending on the measurement temperature, this indicator being measured at five values of V,ZCP set at no more than 5% of the exact value of V,ZCP, as well as those of the aging indicator of the background art (voltage Vce).

The graph in FIG. 6 shows that, with constant degradation, the relative variation of the I,ZCP indicator in the temperature range [20° C., 70° C.] does not exceed 0.2% at Vce,ZCP(in this case 1.145 V) (to be compared with variations of the order of a few percent in order to draw conclusions on the aging), whereas the Vce indicator of the background art shows relative variations of the order of 5% (variation of Vce for Ic=100 A: from 1.63 V to 1.717 V, i.e. a variation of 5.3%), i.e. relative variations of the order of those used to draw conclusions on the aging.

The graph also shows that an inaccuracy in the measurement of Vce,ZCP at which Ic, ZCP is determined only has a moderate impact on the value of Ic,ZCP.

The variation ranges of the Ic,ZCP indicator for a temperature variation from 22° C. to 71° C. are as follows:

- Variation of Ic,ZCP for Vce=1.19 V (+4% with respect to Vce,ZCP): from 40.7 A to 39.86 A, i.e. a variation of 2%;
- Variation of Ic,ZCP for Vce=1.165 V (+2% with respect to Vce,ZCP): from 37.84 A to 37.44 A, i.e. a variation of 1%;
- Variation of Ic,ZCP for Vce=1.145 V (=Vce,ZCP): from 35.61 A to 335.55 A, i.e. a variation of 0.17%;
- Variation of Ic,ZCP for Vce=1.115 V (−3% with respect to Vce,ZCP): from 32.36 A to 32.79 A, i.e. a variation of 1.3%;
- Variation of Ic,ZCP for Vce=1.09 V (−5% with respect to Vce,ZCP): from 29.75 A to 30.55 A, i.e. a variation of 2.6%.

It is therefore understood that knowledge of the temperature is critical for the degradation indicator of the background art, but not necessary for the degradation indicator according to the invention.

Neither does the method require a series of measurements in order to obtain the corresponding state of health at the time t, the purpose of which would be to plot a cluster of characteristics at different temperatures so as to deduce the position of the ZCP point. It suffices simply to determine the voltage V,ZCP a first time, so as to ascertain the reference value V,ZCP0 for step a of the method, for example before installing the power electronics component in a system which embeds it, or for example by means of data supplied by the manufacturer.

It can also be seen from this graph that it is not essential to determine and/or set V,ZCP with very high accuracy in order to implement the method according to the invention. Especially, an inaccuracy of 5% on V,ZCP results in a relative variation of I,ZCP with the temperature of at most 1.5% in the temperature range [45° C., 65° C.], V,ZCP having been determined at 55° C.

The measurement of the voltage V,ZCP0 for step b of the method is set to a relative accuracy that may depend on the type of power electronics component and which may especially have a value of less than 5%, i.e. at the time t1, the voltage V is equal to V,ZCP0 to within plus or minus 5%.

The accuracy with which V,ZCP is determined and/or set in order to implement the method can therefore be adapted to the accuracy required on the degradation indicator, but advantageously an accuracy of less than 5% enables satisfactory results to be obtained without the need to implement costly and/or complex devices.

Figures 5A, 5B:
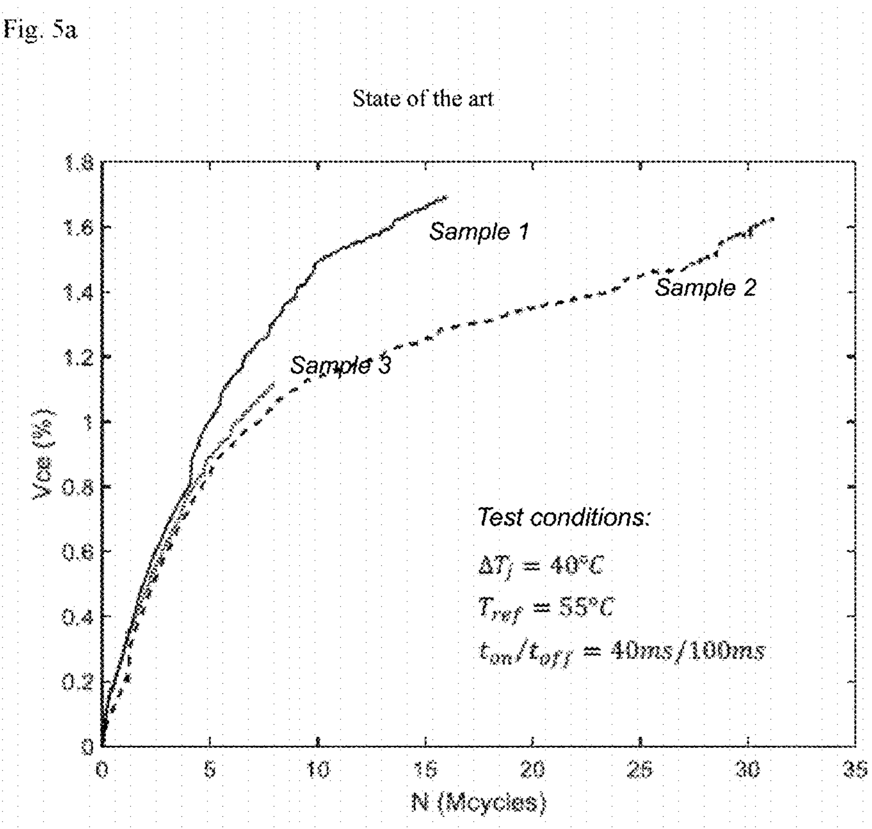
FIG. 5*a* depicts, for an IGBT module, the relative variation of an aging indicator according to the state of the art, namely the voltage Vce measured at a temperature equal to 55° C. and at a current of 100 A, depending on the aging of this module, i.e. the number of temperature cycles to which it has been subjected.
FIG. 5*b* depicts, for an IGBT module, the relative variation of the aging indicator according to the invention, namely the current I,ZCP measured at a voltage V,ZCP equal to 1.14 V, depending on the aging of this module, i.e. the number of temperature cycles to which it has been subjected.

FIG. 5*a* depicts, for three Mitsubishi IGBT modules bearing the same CMT150TX reference, the relative variation of a degradation indicator of the background art, namely the voltage Vce measured at a temperature equal to 55° C. and at a current of 60 A, depending on the degradation of this module, i.e. on the number of temperature cycles to which it has been subjected.

Three different modules were tested (sample 1, sample 2, sample 3), to the extent that the degradation of these electronic components is random in nature, so that disparities in degradation can occur for two components from the same batch, for example.

FIG. 5*b* depicts, for the same IGBT modules, the relative variation of the degradation indicator according to the invention, namely the current I,ZCP measured at a voltage V,ZCP equal to 1.14 V, depending on the degradation of this module, i.e. the number of temperature cycles to which each module has been subjected.

Figure 5C:
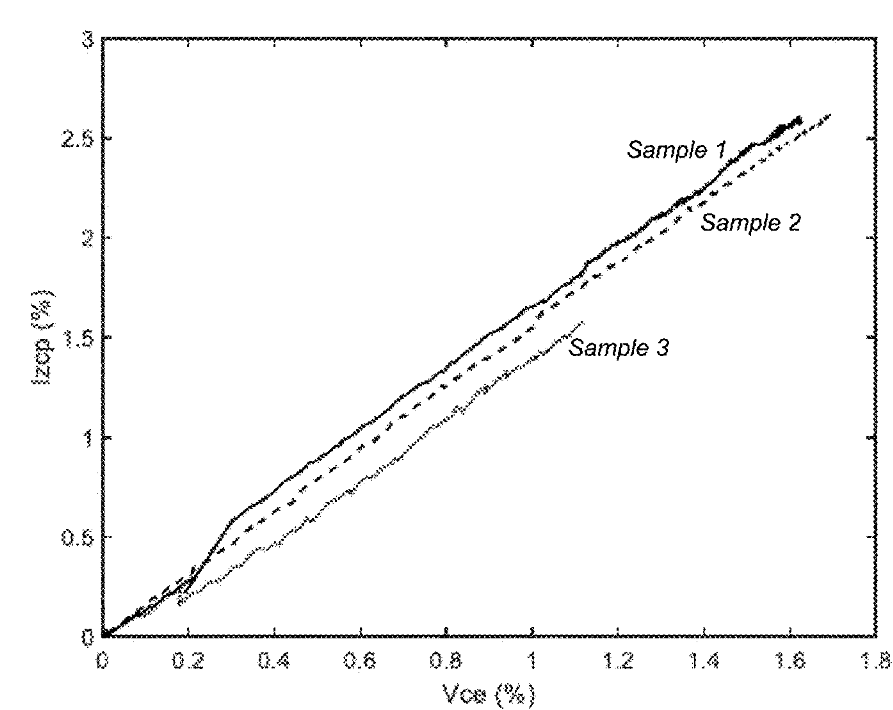
FIG. 5*c* depicts, for an IGBT module, the aging indicator according to the invention I,ZCP of FIG. 5*b* depending on the aging indicator of the background art (voltage Vce) of FIG. 5*a*.

FIG. 5*c* depicts, again for the same IGBT modules, the degradation indicator according to the invention I,ZCP of FIG. 5*b* depending on the degradation indicator of the background art (voltage Vce) of FIG. 5*a*.

In other words, a curve in FIG. 5*c* depicts the correspondence between the results obtained on the relative variation of the new indicator I,ZCP and that of the state of the art Vce, as the degradations progress.

This figure shows that there is a bijection between I,ZCP (t) and V,ZCP(t). If V,ZCP(t) is acknowledged as a satisfactory indicator of the state of aging of the component, then I,ZCP(t) is also a satisfactory indicator of this state of degradation.

On the other hand, it is noted that I,ZCP(t) is practically a linear function of V,ZCP(t), with a slope greater than 1. The sensitivity of I,ZCP(t) is therefore better than that of V,ZCP(t), in this case by a factor of 1.5 to 2.

It is therefore clear that the method according to the invention is particularly advantageous, since it makes it possible not only to dispense with the need for a temperature sensor, but also provides a more sensitive indicator of the state of health of the component, allowing a maintenance strategy to be drawn up for systems embedding the power electronics component, with improved confidence intervals.

The simplicity of the method allows it to be implemented in situ to diagnose the state of health of a component in real time.

The indicator D(ti) of the state of health of the electronic component at the time ti can be deduced from I,ZCP(ti), for example by comparison with I,ZCP(t0). Thus, it is possible to compute the ratio of I,ZCP(ti) to I,ZCP(t0) or the absolute or relative variation of I between the “initial time” state and the “time ti” state, in other words the absolute or relative variation of I,ZCP between t=0 and t=ti since I(t=0) is by definition of the “initial time” state equal to I,ZCP(t0) and I(ti) is by definition of the “initial time” state equal to I,ZCP(ti).

In this case, it is possible to set an absolute or relative threshold, depending on the model of the electronic component or specific to a given electronic component, according to the level of requirement set for the diagnosis.

For example, an electronic component whose state-of-the-art aging indicator, which is the voltage measured at a fixed current and temperature, has varied by 5% with respect to the new component is commonly considered to be degraded. Given the greater sensitivity of the I,ZCP(ti) indicator, in order to obtain an equivalent diagnosis, it may be considered necessary to replace the component if I,ZCP (ti) has undergone a relative reduction of 8% to 10% with respect to the new state.

It is also possible to compute a quantitative indicator D(ti) of the state of health of the component by computing the ratio of the difference (I,ZCP(ti)−I,ZCP(initial)) and the difference (I,ZCP(final)−I,ZCP(initial)), wherein I,ZCP(final) is taken to be the value reached when the level of degradation of the component requires it to be replaced, for example, and I,ZCP(initial) corresponds to the healthy component.

In this case, the degradation indicator is zero for a healthy component and equal to 1 for the component to be replaced.

Especially, I,ZCP(initial) can be measured on a component representative of the component on which the method is implemented, for example a component bearing the same supplier reference.

It is possible, in the context of real-time monitoring, to repeat iteratively, for example periodically, the measurement of the intensity of the collector current I,ZCP(ti) at the time ti at the zero temperature coefficient point of the electronic component and the deduction of the quantitative indicator D(ti) of the state of health of the electronic component.

The method can be applied to individual electronic components (diode, IGBT module) or to combinations of mixed and/or bipolar electronic components used in power conversion systems such as inverters.

Figure 7:
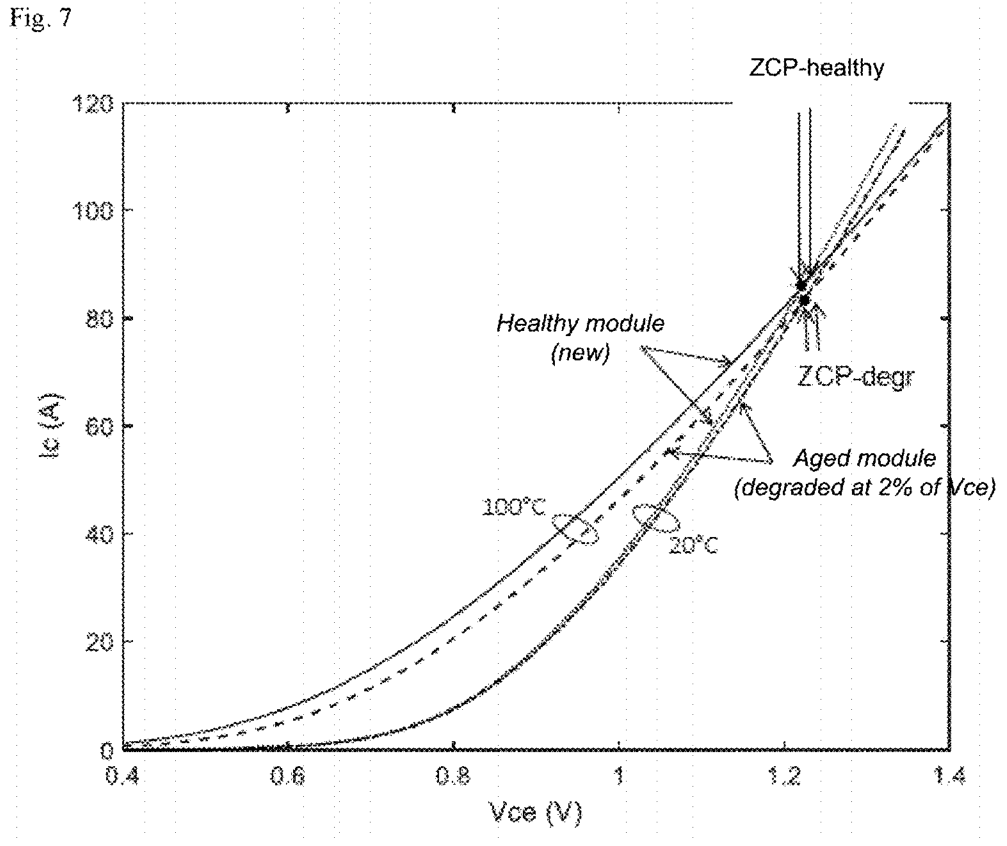
FIG. 7 depicts the ZCP point of an IGBT module bearing reference SKIM63 (300 A, 1200 V) comprising four chips in parallel, obtained for the non-degraded module (ZCP-healthy) and for the degraded module (ZCP-degr).

This can be seen in FIG. 7, depicting the ZCP point of an IGBT module bearing reference SKIM63 (300 A, 1200 V) comprising four chips in parallel, obtained for the non-degraded module (ZCP-healthy) and for the degraded module (ZCP-degr), the degradation in this case corresponding to a relative decrease of 2% in the degradation indicator of the background art Vce, measured at a temperature equal to 55° C.

The ZCP-healthy and ZCP-degr points are vertical to each other, i.e. they correspond to the same voltage V,ZCP, while I,ZCP varies significantly.

Specifically, between the ZCP-healthy and ZCP-degr points, V,ZCP varies from 1.2209 V to 1.2243 V, a relative variation of 2.8%. (per thousand), while I,ZCP varies from 85.7152 A to 83.4417 A, a relative variation of 2.7% (percent), a variation of the order of 10 times greater than that of V,ZCP.

Once again, it can be seen that the degradation indicator according to the invention is not only easier to implement than the indicators of the background art, since they do not require ascertaining the temperature, but also more sensitive: in the case of FIG. 7, I,ZCP undergoes a relative variation of 2.7%, while the aging indicator of the background art Vce undergoes a relative variation of only 2%.

In the associations of electronic components, the temperature cycling of each component is due not only to the self-heating of that component, but also to the heating of neighboring components. There is therefore a coupling of the degradations of the individual components, so that it may be relevant to monitor the state of health of the association as a whole.

In the latter case, one or more voltage transducers are used, as well as one or more current transducers distributed depending on the nature of the electrical associations (series, parallel). For example, in order to monitor the state of health of an inverter, it is possible to dedicate one voltage sensor to each chip, and one current sensor to each inverter arm.

The invention also relates to a measuring device for implementing the method for measuring the state of health of a semiconductor-based power electronics component having at least one input terminal and one output terminal for the electric current of intensity I, between which a voltage V is established, the electronic component having a temperature-independent zero temperature coefficient point ZCP, according to any of the embodiments described hereinbefore.

The measuring device comprises at least one current sensor making it possible to measure the intensity I of the electric current I,ZCP flowing through the input terminal (or the output terminal) at any time.

In one embodiment, the measuring device also comprises a voltage sensor for measuring the voltage established between the input and output terminals of the power electronics component.

In one particular embodiment, the measuring device also comprises a processor that exchanges data with the current and/or voltage sensor.

The voltage and current sensors can be configured to implement the following steps:

a—a first step of determining, at an initial time t0, a first current I,ZCP(t0) when the voltage V is equal to a voltage V,ZCP0, the power electronics component being in an "initial time" state b—a step of measuring a current I,ZCP(ti) at one or more subsequent times ti, when the voltage V at each time ti is equal to the voltage V,ZCP0, the power electronics component then being in a "time ti" state;

c—a step of the processor computing a quantitative indicator D(ti) of the degradation of the power electronics component for each time ti, the value of which indicator depends on the variation in the value of the current I,ZCP(ti) between the "initial time" state and the "time ti" state In one particular embodiment of the measuring device, the at least one semiconductor-based power electronics component is of the bipolar or mixed type.

In one particular embodiment, the measuring device is a chip connected to the power electronics component.

In one particular embodiment, the measuring device is a portable device external to the electronic component, enabling especially the measurement of the state of degradation for one component, and the device can then be disconnected from this first component in order to be connected to a second component.

Advantageously, the electronic component has a characteristic tracer if the electronic component is extracted from its system, i.e. isolated from its environment. The invention also relates to a power electronics module integrating one possible embodiment of the previously disclosed measuring device, the measuring device being used for one or more electronic components in parallel and/or in series.

In one particular embodiment, the measuring device equips a power electronics module comprising at least two electronic components in parallel and/or in series, and the measuring device makes it possible to monitor the state of health of one or more or of each of the power electronics components of the electronic module.

The invention also relates a system embedding: one or more of the previously disclosed modules and a measuring device for one or more of these modules. Each measuring device provides an indicator of the degradation of one or more of the semiconductor-based power electronics components of the module it equips, or of the module as a whole. The indicator is obtained by the measuring method comprised in the modules.

In one particular embodiment, the embedding system is an electric transport system such as electric vehicles, trains, subways, streetcars, bicycles, motorcycles, buses, elevators, moving walkways, escalators, etc.

In another particular embodiment, the embedding system is a system for managing and/or converting electrical energy for renewable energies, such as wind, marine or solar systems, among others.

In one particular embodiment, the embedding system is a stationary system such as charging stations for electric cars, speed controllers, switched-mode power supplies, induction heating, electrical energy recovery, etc.

The invention also relates to a computing program comprising program code instructions for executing the steps of the method for measuring the state of health of a semiconductor-based power electronics component described according to one possible embodiment of the invention when the program is executed by a processor.

Advantageously, the processor is embedded and is a chip capable of performing computations. For example, the chip is an FPGA.

In one particular embodiment, the method for measuring the state of health of the computing program is applied to the system embedding one or more of the previously disclosed modules; if the measuring method returns a quantitative indicator of degradation signaling a degradation, the computing program applies the measuring method to each semiconductor-based power electronics component of the embedding system. The computing program is applied firstly to assess the system as a whole, the computing program is applied secondly to identify the components that are starting to degrade.

LIST OF REFERENCE SIGNS

1: IGBT module
11: power connection terminals
12: bonding wire
13: silicon chip
14: copper layer
15: layer of ceramic material
16: case support (or base plate)
17: chip soldering

The invention claimed is:

1. A method for measuring the state of health, at several times ti, of at least one semiconductor-based power electronics component by computing a quantitative indicator D(ti) of the degradation of the power electronics component, in order to determine the progression of the aging of said power electronics component, the power electronics component having at least one input terminal and one output terminal for an electric current of intensity I, between which a voltage V is established, the power electronics component having a zero temperature coefficient point ZCP defined by an electric current I,ZCP and a voltage V,ZCP, ZCP being independent of the temperature, the method using an electric current sensor, a voltage sensor and a processor exchanging information with said sensors, the method comprising:

a—a first step of determining, at an initial time t0, a first current value I(t0)=I,ZCP0 when the voltage V is equal to a voltage V(t0)=V,ZCP0, the power electronics component then being in an "initial time" state;

b—a step of measuring a value of the current I at each subsequent time ti, when the voltage V at the time ti of the power electronics component is equal to the voltage V,ZCP0, the power electronics component then being in a "time ti" state;

c—a step of the processor computing a quantitative indicator D(ti) of the aging of the power electronics component at each subsequent time ti, the value of which indicator depends on the variation in the value of the current I between the "initial time" state and the "time ti" state, the aging being independent of the voltage V,ZCP but dependent on the current I,ZCP, which decreases with aging.

2. The measuring method according to claim 1, comprising a measurement of the current I,ZCP(ti) when the steady-state voltage is at the value V,ZCP0, wherein the intensity of the electric current I(ti) in the time t state corresponds to the current I,ZCP(ti) at the zero temperature coefficient point of the electronic component, the measurement being made without the need for any additional measurement, especially by means of a temperature sensor.

3. The measuring method according to claim 1, wherein no temperature sensor is implemented and no temperature estimation is required for steps a, b and c, the quantitative indicator D(ti) of the degradation of the electronic component being independent of the temperature.

4. The measuring method according to claim 1, wherein the measuring method comprises, prior to step a:

i—a step comprising at least two series of measurements of the electric current I by the electric current sensor and of the voltage V by the voltage sensor, the series of measurements (I,V) being taken at different temperatures;

ii—a step of the processor computing a voltage value V,ZCP0 and an electric current value I,ZCP0 at the zero temperature coefficient point ZCP, from the measurements of step i, the zero temperature coefficient point ZCP being the point of intersection of the two series of measurements (I,V) of step i, the current I(t0) and voltage V(t0) at the "initial time" state being equal to I,ZCP0 and V,ZCP0, respectively.

5. The measuring method according to claim 1, wherein the at least one semiconductor-based power electronics component is embedded or installed in an operational electrical system, the method for measuring the state of health of the component being carried out while the electrical system is in operation.

6. The measuring method according to claim 1, wherein the measurement of the voltage V(ti) is carried out in step b with a relative accuracy that depends on the type of power electronics component, this relative accuracy having a value of less than 5%.

7. The measuring method according to claim 1, wherein the degradation concerns the degradation of the electrical interconnections of the components.

8. The measuring method according to claim 1, wherein the state of health corresponding to the time t in step c) is obtained without carrying out a series of measurements which would aim to trace a cluster of characteristics at different temperatures so as to deduce the position of the ZCP point, wherein the point of intersection of the cluster of characteristics corresponding to a given state of health is the ZCP point corresponding to said state of health, the voltage V,ZCP being determined a first time to obtain the voltage V,ZCP0 so as to implement step a) of said method.

9. The measuring method according to claim 1, wherein the indicator D(ti) of the state of health of the electronic component at the time ti is determined by comparing the current at the time i I,ZCP(ti) with the current at the initial time I,ZCP(t0).

10. The measuring method according to claim 1, wherein the quantitative indicator D(ti) of the state of health of the component at the time ti is determined by computing the ratio of the difference of the current at the time i I,ZCP(ti) and the current at the initial time I,ZCP(t0)) and of the difference between the current at a final time I,ZCP(tfinal) and the current at the initial time I,ZCP(t0)) wherein the current at the final time I,ZCP(tfinal) is the value reached when the level of degradation of the component requires its replacement and wherein the current at the initial time I,ZCP(t0) corresponds to the intensity of the component in the healthy state.

11. A device for measuring the state of health, at one or more times ti, of at least one semiconductor-based power electronics component by computing a quantitative indicator D(ti) of the degradation of the power electronics component, in order to determine the progression of the aging of said power electronics component, the device having at least one input terminal and one output terminal for the electric current of intensity I, between which a voltage V is established, the power electronics component having a zero temperature coefficient point ZCP defined by an electric current I,ZCP and a voltage V,ZCP,ZCP being independent of the temperature, the device comprising an electric current sensor, a voltage sensor and a processor exchanging information with said sensors, configured to implement the following steps:

a—a first step of determining, at an initial time t0, a first current I(t0)=I,ZCP0, when the voltage V is equal to a voltage V(t0)=V,ZCP0, the power electronics component being in an "initial time" state;

b—a step of measuring a value of the current I at each subsequent time ti, when the voltage V at the time ti is equal to the voltage V,ZCP0, the power electronics component being in a "time ti" state;

c—a step of the processor computing a quantitative indicator D(ti) of the aging of the power electronics component at each subsequent time ti, the value of which indicator depends on the variation in the value of the current I between the "initial time" state and the "time ti" state, the aging being independent of the voltage V,ZCP but dependent on the current I,ZCP, which decreases with aging.

12. The device according to claim 11, characterized in that the at least one semiconductor-based power electronics component is bipolar or mixed.

13. A power electronics module integrating a device according to claim 11 for at least two electronic components in parallel and/or in series.

14. A system embedding one or more power electronics modules according to claim 13, the device for measuring the state of health of at least one power electronics component integrated into each module providing a quantitative indicator of degradation.

15. A system embedding one or more power electronics modules according to claim 14, the system being a system for managing electrical energy and/or converting electrical energy for renewable energies or a transport system with electric traction or a stationary system.

* * * * *